(12) United States Patent
Jackson et al.

(10) Patent No.: US 6,192,919 B1
(45) Date of Patent: Feb. 27, 2001

(54) CHEMICAL DELIVERY AND CONTAINMENT SYSTEM EMPLOYING MOBILE SHIPPING CRATE

(75) Inventors: Robert M. Jackson, Burnet; Craig Esser, Austin, both of TX (US); Eric Serdahl, Mountain View, CA (US); John N. Gregg, Marble Falls, TX (US)

(73) Assignee: Advanced Delivery & Chemical Systems, Ltd., Austin, TX (US)

( * ) Notice: Subject to any disclaimer, the term of this patent is extended or adjusted under 35 U.S.C. 154(b) by 0 days.

(21) Appl. No.: 09/475,387

(22) Filed: Dec. 30, 1999

Related U.S. Application Data

(62) Division of application No. 09/105,423, filed on Jun. 26, 1998, now Pat. No. 6,029,718.
(51) Int. Cl.[7] .................................................... F17D 1/00
(52) U.S. Cl. ................... 137/382; 137/377; 137/315.11; 137/315.01; 312/350; 312/237
(58) Field of Search .................................. 137/377, 382, 137/315.11, 315.01; 312/350, 237

(56) References Cited

U.S. PATENT DOCUMENTS 5,255,821 * 10/1993 Hall et al. .............................. 222/39
5,381,902 * 1/1995 Dumser et al. ....................... 137/377
5,921,270 * 7/1999 McCarty .............................. 137/240
6,041,812 * 3/2000 Hilbers ................................. 137/377

* cited by examiner

Primary Examiner—A. Michael Chambers
Assistant Examiner—Thomas L. McShane
(74) Attorney, Agent, or Firm—O'Keefe, Egan & Peterman

(57) ABSTRACT

This invention concerns a shipping crate, comprising: a base having three sides and one or more doors attached thereto, wheels attached to the base, a top attached to the sides having a tank hole, wherein the base, sides, and doors have been attached to provide a sealed compartment. This invention also concerns a chemical delivery cabinet, comprising: a base, three sides, and one or more doors attached to one or more sides, a valve manifold affixed to an inner wall of the cabinet, process control instrumentation which connects to and controls the valve manifold, wherein at least one of the doors has a touch control pad mounted thereon. This invention is also a chemical refill system, comprising a tank housed in a crate, wherein the crate comprises a base having three sides and one or more doors attached thereto, wheels attached to the base, a top attached to the sides having a tank hole, wherein the top has been fastened to the sides such that the tank hole fits over a vertical sheath on the tank, wherein the base, sides, and doors have been attached to provide a sealed compartment. In one embodiment of this invention, the system is been placed in the chemical delivery cabinet.

12 Claims, 3 Drawing Sheets

CHEMICAL DELIVERY AND CONTAINMENT SYSTEM EMPLOYING MOBILE SHIPPING CRATE

This application is a divisional of application Ser. No. 09/105,423, filed Jun. 26, 1998 now U.S. Pat. No. 6,029,718.

BACKGROUND OF INVENTION

This invention relates to shipping crates for chemicals such as tetraethylorthosilicate ("TEOS") which is used in integrated circuit fabrication.

In the semiconductor industry, a variety of chemicals are employed during the fabrication of integrated circuits. For example, TEOS is widely used as a feed stock to a plasma enhanced reactor which forms silicon dioxide layers. Such chemicals are often shipped in bulk delivery tanks, such as 200 liter canisters. When filled, these tanks can be quite heavy; for example, filled tanks may weigh 600 pounds or more. As a result, forklifts have previously been used to move filled tanks, including use of forklifts when placing the filled canister in a storage and delivery cabinet. However, use of a forklift is prone to difficulties, such as potential rupture of the vessel, difficulty of loading such tanks in narrow walkways, lack of access in cleanrooms, and so forth.

The tanks have been housed in delivery cabinets. The delivery cabinets include hardware for attached to the tanks, and for withdrawing chemicals from the tanks and sending the withdrawn chemicals to a delivery point, typically a smaller delivery canister. Prior cabinets functioned as containment vessels. The cabinets have heretofore been oversized so that a spill may collect in the bottom of the cabinet. For instance, a grating is typically installed to act as a false floor, with the tank resting on the grating. The grating permits liquid spills to run into the reservoir in the bottom of the cabinet. A chemical spill in a conventional cabinet is, however, problematic for several reasons. For instance, the cabinet itself must be taken off line so that it can be cleaned. As a result, supply of chemical from the contaminated cabinet is foreclosed during clean-up. Such down time of the supply cabinet may result in temporary shut down of the process equipment utilizing the cabinet for chemical supply. For bulk cabinets of this size, up to 30 systems could be potentially be down, which would be very costly event during integrated circuit fabrication.

Furthermore, because the cabinet is oversized as protection in the event of a spill, the cabinets may take up more space than would otherwise be desirable. Since space is valuable in any fabrication operation, a system which enables containment of spills but which has a smaller size would be highly desirable. Likewise, since prior bulk cabinets included the aforementioned grating, the bulk tanks needed to be lifted for placement in the cabinet.

SUMMARY OF INVENTION

The present invention provides a solution to one or more of the disadvantages and deficiencies described above. In particular, this invention provides a combination shipping/containment crate (or "cart"), which facilitates use of a storage and delivery cabinet of reduced size in comparison to conventional cabinets used in the semiconductor industry. One significant advantage to this invention is that the cart of this invention may be transported readily into narrow, crowded chemical storage areas, and into cleanroom areas. In one broad respect, this invention is a shipping cart, comprising: a base having four sides, wheels attached to the base, a top attached to the sides having a tank hole, wherein the base and sides have been attached to provide a sealed compartment.

In another broad respect, this invention is a chemical refill system, comprising a tank housed in a crate, wherein the crate comprises a base having four sides, wheels attached to the base, a top attached to the sides having a tank hole, wherein the top has been fastened to the sides such that the tank hole fits over a vertical sheath on the tank, wherein the base and doors have been attached to provide a sealed compartment. In one embodiment of this invention, the system is placed in the chemical delivery cabinet.

In another broad respect, this invention is a chemical delivery cabinet, comprising: a base, three sides, and one or more doors attached to one or more sides, a valve manifold affixed to an inner wall of the cabinet, process control instrumentation which connects to and controls the valve manifold, wherein at least one of the doors has a touch control pad mounted thereon.

In yet another broad respect, this invention is a process useful for supplying a refill tank, comprising: providing a crate which comprises a base having four sides, wheels attached to the base, a top attached to the sides having a tank hole, wherein the top has been fastened to the sides such that the tank hole fits over a vertical sheath on the tank, wherein the base and sides have been attached to provide a sealed compartment; providing a tank; placing the tank in the crate with the tank hole fitting over a vertical sheath of the tank; filling the tank with a liquid chemical before or after placing the tank in the crate.

This invention has a number of advantages. For example, the shipping crate of this invention facilitates easy maneuvering and installation of a filled tank in a refill cabinet. Advantageously, the shipping cart may even be maneuvered into a cleanroom. Hence, widened aisles and the like previously required in order to place a refill tank in a refill cabinet are rendered unnecessary in view of this invention. Advantageously, the crate is adapted to function as a self-containment vessel in the event of a chemical leak or spill from the tank. More advantageously, since the shipping crate functions as a self-containment vessel, the cabinet housing the valve manifold and lines can be reduced in size, thereby saving space in a manufacturing operation. Furthermore, if a spill or leak should occur, the tank may be readily drained and changed out by simply withdrawing the shipping crate from the cabinet, and installing a new crate, thereby effectively eliminating down time in the manufacturing process.

DETAILED DESCRIPTION OF THE INVENTION

Figure 1:
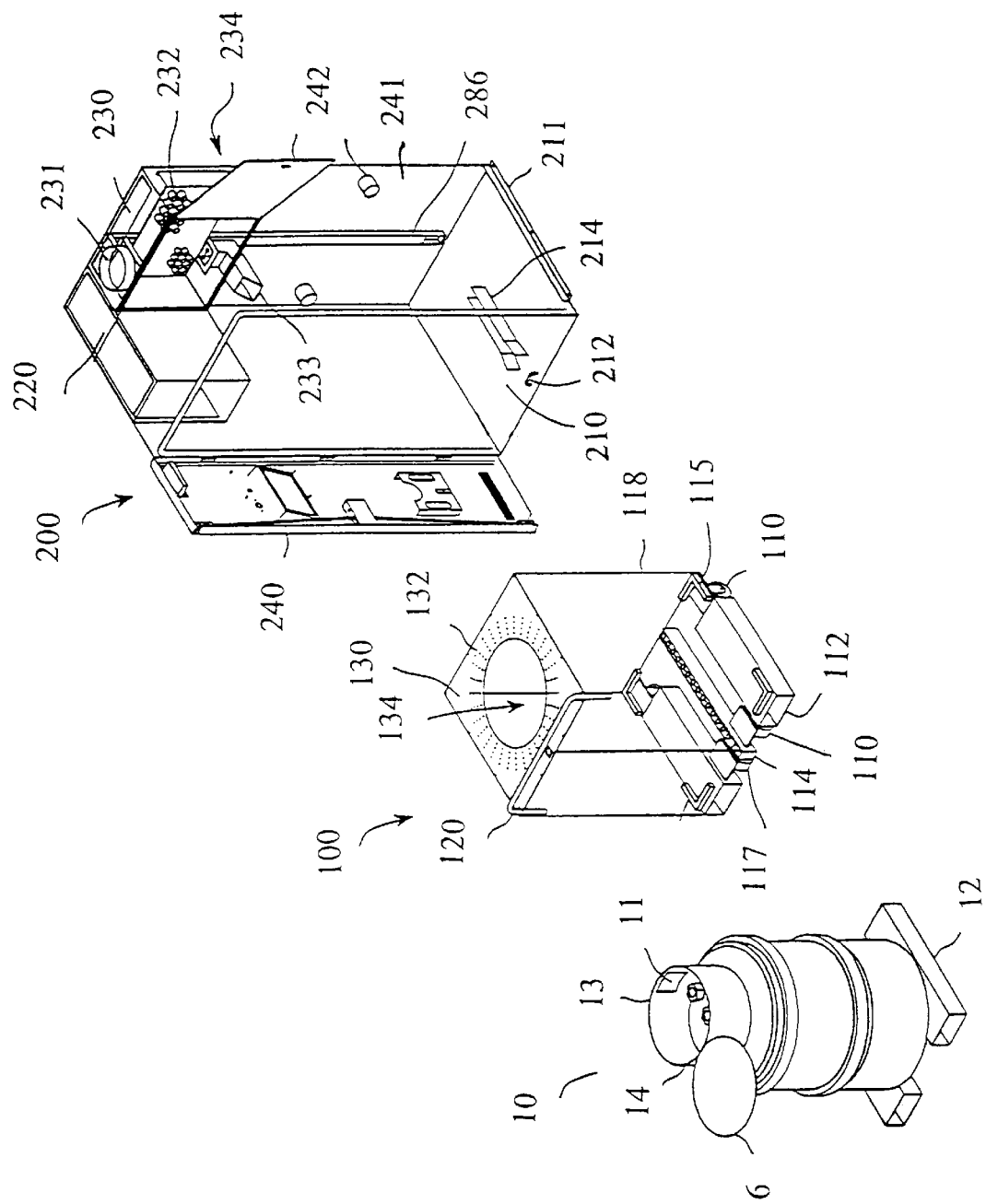
FIG. 1 shows a tank, a shipping cart (or "crate"), and a cabinet of this invention.

FIG. 1 shows a bulk delivery system representative of the present invention. The system includes bulk chemical tank 10, a mobile containment shipping cart (or "crate") 100, and a bulk chemical cabinet 200 to house tank 10 and crate 100. In practice, tank 10 may be placed in cart 100 by lifting it using an overhead crane or the like when appropriate holds are on the tank 10.

The tank 10, which may also be variously referred to as a canister or storage vessel, may be of a wide variety of sizes, with a 50 liter size being especially applicable for use in the practice of the present invention. Such canisters are well known, and typically made from stainless steel, with or without a liner. Tank 10 includes fittings 13 by which lines (not shown) may be connected so that the chemicals can be delivered from the tank while maintaining a very high purity. The tank 10 may include internal lines (not shown) to the bottom, as well as sensors to detect the level of chemicals in the tank 10. The sensors can be a vapor sensor, a liquid sensor, or both. In addition, tank 10 includes hole 11 in vertical sheath 14 for receiving scoop 233, described below. It should be appreciated that the particular fittings 13 employed may vary widely, and simply need to be matched with appropriate fittings of lines emanating from valve manifold 230. Tank 10 may also include sleeves 12 which may be welded to the tank 10 or which may be simply placed under tank 10 to be held in place when at rest by the weight of tank 10. The sleeves 12 may be appropriately designed to receive the forks of a forklift.

As shown in FIG. 1, movable crate 100 includes wheels (rollers) 110, attached to base 116, which may be of appropriate size and suitably durable depending on the size of the tank 10. The wheels 110 may include brakes, including a parking brake. Crate 100 may include sleeves 112, as part of or attached to base 116, to receive forks of a forklift, for example. The crate 100 may include a drain line for facilitating removal of at least a portion of a liquid spill prior to removing a crate 100 from a cabinet 200. Crate 100 may include guide 114 which aligns with guide 214 in the cabinet 200 to facilitate alignment of the crate 100 as it is positioned into cabinet 200. The guide 114 may be a part of or attached to base 116, and may be secured to base 116 using conventional methods (e.g., using screws or bolts, or by welding). Alternatively, the guide 114 may be designed as a rail, for example, which is attached to the one or more sides of the cart 100. Likewise, the cabinet may be equipped with other alignment devices, such as a laser. Also attached to base 116 are four exterior walls 118. Optionally, the base may be appropriately fitted and/or equipped with gasket material to seal the crate 100 against leakage if a chemical spill occurs. The base may be angled, grooved, or the like toward the sensor 117. Similarly, the base may optionally include a low volume trough to collect small spills, thereby enhancing the ability of the sensor 117 to detect such small spills. The cart 100 may include an exhaust duct to provide ventilation for vapor which is denser than air. Handle 120 may be optionally secured to crate 100 to assist an operator in maneuvering crate 100. The top 130 of crate 100 may include an appropriate sized hole 134 to accommodate the top of tank 10. It is preferred that hole 134 be dimensioned so that top 130 snugly fits to assist in securing tank 10 within crate 100 during shipping and movement. Top 130 may also be perforated with holes 132. The holes 132 serve to allow a leak in the upper portion of tank 100 to drain into the lower portion of crate 100. In addition sensor 117 may be included to sense liquid spills. It is currently recommended in the industry that the volume of a containment unit be at least 110% of the volume of tank 10. Accordingly, in one embodiment of this invention, the crate 100 is constructed such that it has a capacity of at least 110% of the internal volume of the tank 10 which crate 100 is designed to house.

The tanks may be loaded with a variety of chemicals, and are typically burdened with high purity chemicals for use in semiconductor manufacture. For example, the canisters may contain TEOS, arsenic compounds, titanium compounds, boron compounds, and so forth. In one embodiment of this invention, the canister 110 is at least partially filled with a chemical which is at least 99.9999% pure based on the amount of trace metals in the chemical.

Cabinet 200 includes three sides 241, a base 210, door(s) 240, and a top. One or more brace 211 may be attached to support to the structure, as by bolting to the floor where the cabinet is housed. When two doors are employed, door stop 212 may be included. The cabinet may include a compartment 220 (or "control box") for installation of process control instrumentation. Alternatively, the process control instrumentation may be situated outside the cabinet. Process control instrumentation is well known and available from various commercial sources, such as Omron, Inc. The process control instrumentation may be connected to touch screen 243 illustrated in FIG. 2. The cabinet may include a valve manifold 230 having a given number of valves 232 (e.g., pneumatically actuated valves), such as described in U.S. Pat. Nos. 5,465,766; 5,562,132; 5,607,002, or in a U.S. patent application filed on the same day as this application entitled IMPROVED REFILL SYSTEM AND MANIFOLD by Robert Jackson, all of which are incorporated herein by reference. Valves 232 may be controlled using process control instrumentation housed in control box 220. A manifold door 234 may be included to close off valve manifold. Scoop 233 may be included in cabinet 200 from which manifold lines may be placed. The scoop 233 may be appropriately dimensioned to fit into hole 11 of tank 10. Cabinet may also include exhaust outlet 231. Optionally, bumpers 242 may be attached on the rear side of cabinet 200 to act as stops for crate 100.

Figure 2:
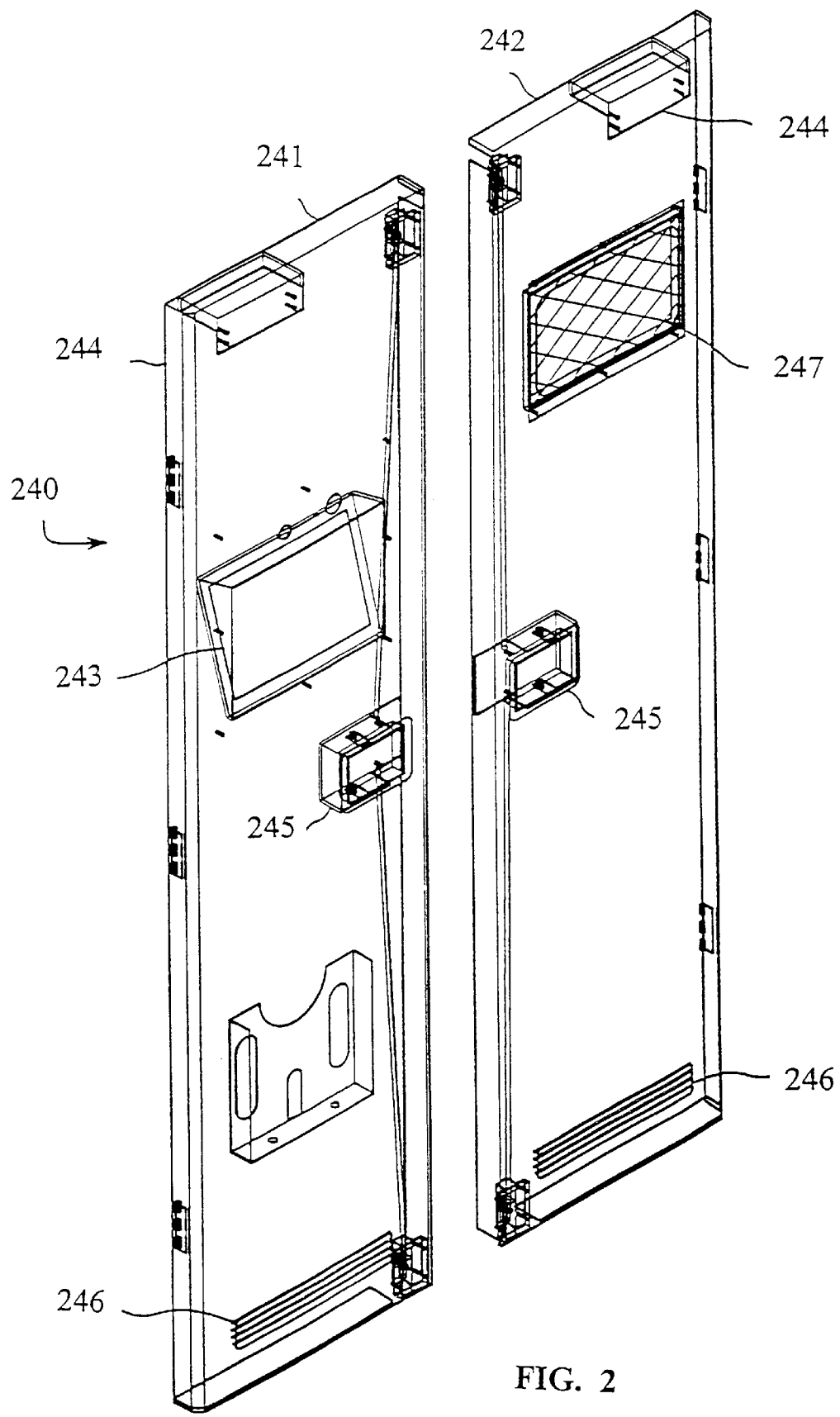
FIG. 2 shows a door used in the cabinet of this invention.

FIG. 2 shows a dual door system for use as door(s) 240 in cabinet 200 in FIG. 1. In FIG. 2, left door 242 and right door 241 are depicted with the side interior to the cabinet 200 being shown. Each door may include spring loaded hinges 244 to mount each door to cabinet 200, door locks 245, and vents 246. In addition, door 241 may include touch screen 243 which connects to process control instrumentation, as described above. The touch screen 243 may serve to allow an operator to observe or change the process configuration.

Figure 3:
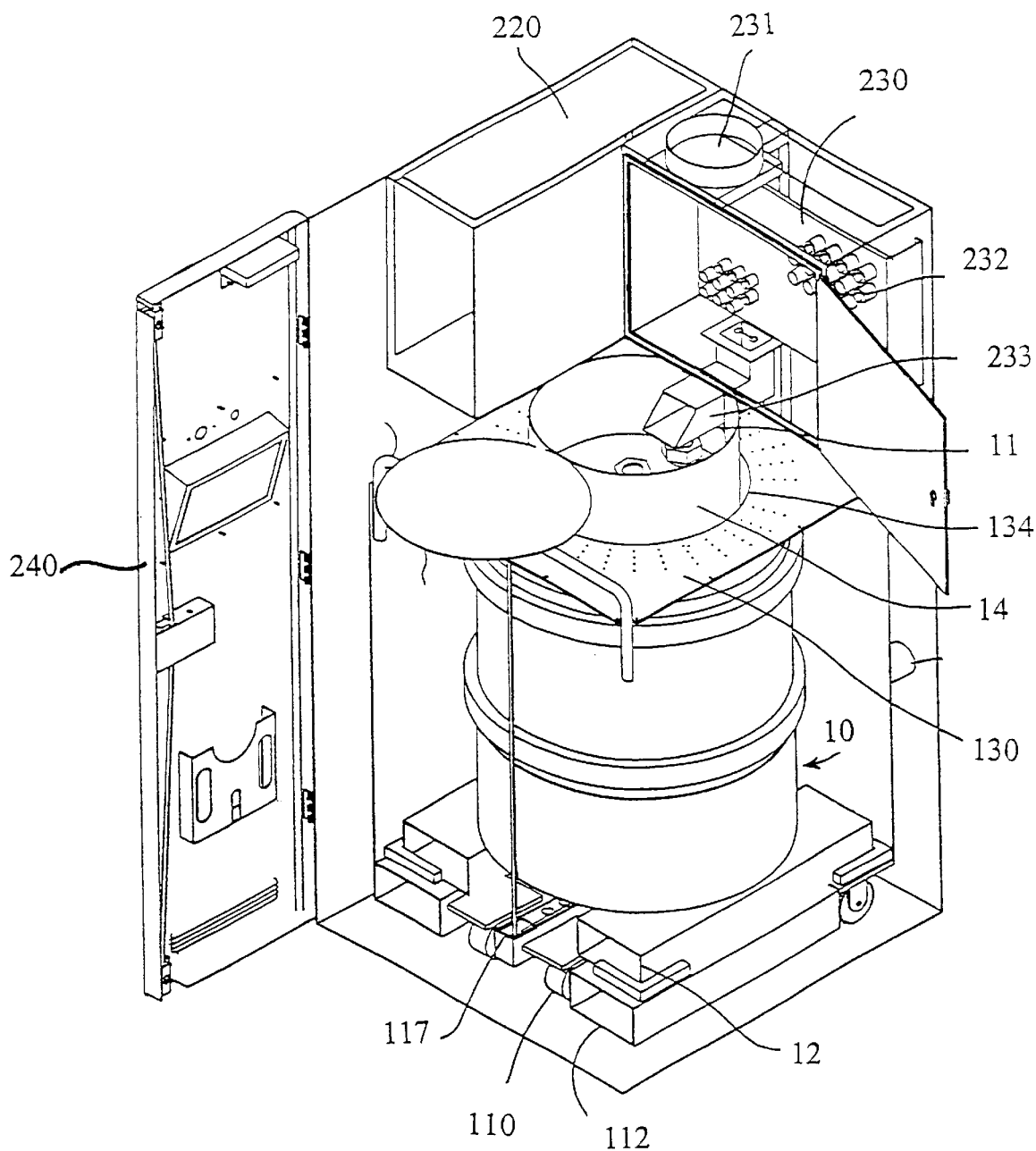
FIG. 3 shows a cabinet which houses a crate having a tank installed therein.

FIG. 3 illustrates tank 10 when placed in crate 100 which is housed in cabinet 200. FIG. 3 thus shows the configuration of the system of this invention. Tank 10 has been placed in crate 100 as by use of crane, with top 130 thereafter being secured onto crate 100, which thereby diminishes lateral movement and sway of tank 10. Tank 10 may be filled either before or after installation into crate 100. In FIG. 3, it can be seen that scoop 233 may be slid through hole 11 in vertical sheath 14 such that "pigtails" (i.e., manifold lines) may be protected from abrasion from the edge of hole 11. It can also be seen that vertical sheath 14, which protects fittings 13 during handling, fits in hole 134 of perforated crate top 130. In addition, The tank 10 may be placed in crate 100 by lifting the tank 10, and moving and placing the tank 10 in crate 100. The crate 100 containing the tank 10 may be conveniently moved by simply pushing by hand, since the crate 100 is equipped with heavy duty wheels (rollers) 110. Advantageously, the crate 100 may be pushed into storage and delivery cabinet 200. As depicted in FIG. 1, the cabinet 200 and crate 100 are configured with guides 114 and 214 to assist the operator in placing the crate 100 into cabinet 200. An advantage of the present invention is that since the movable crate 100 functions to contain a spill should it occur, cabinet 200 is reduced in size relative to a conventional cabinet since the grating/reservoir is not needed. In addition, the tank 10 need not be lifted or raised in order to install it as in a conventional cabinet, since no grating and reservoir is housed within the cabinet. The cabinet and movable self-containment system of this invention thus requires less space while nonetheless providing containment.

What is claimed is:

1. A chemical delivery cabinet, comprising:

a base, three sides, and one or more doors attached to one or more sides, a valve manifold affixed to an inner wall of the cabinet, process control instrumentation which connects to and controls the valve manifold, wherein at least one of the doors has a touch control pad mounted thereon, wherein the process control instrumentation is housed in a compartment mounted to one or more internal walls of the cabinet.

2. The cabinet of claim 1, wherein a grating is absent from the lower portion of the cabinet.

3. The cabinet of claim 1, wherein the cabinet includes an exhaust outlet on top of the cabinet.

4. A chemical delivery cabinet, comprising:

a base, three sides, and one or more doors attached to one or more sides, a valve manifold affixed to an inner wall of the cabinet, process control instrumentation which connects to and controls the valve manifold, wherein at least one of the doors has a touch control pad mounted thereon, wherein a scoop is connected to the valve manifold.

5. The cabinet of claim 4, wherein the process control instrumentation is housed in a compartment mounted to one or more internal walls of the cabinet.

6. The cabinet of claim 4, wherein a grating is absent from the lower portion of the cabinet.

7. The cabinet of claim 4, wherein a guide member is part of the base.

8. The cabinet of claim 4, wherein the cabinet includes an exhaust outlet on top of the cabinet.

9. A chemical delivery cabinet, comprising:

a base, three sides, and one or more doors attached to one or more sides, a valve manifold affixed to an inner wall of the cabinet, process control instrumentation which connects to and controls the valve manifold, wherein at least one of the doors has a touch control pad mounted thereon, wherein a guide member is part of the base.

10. The cabinet of claim 9, wherein the process control instrumentation is housed in a compartment mounted to one or more internal walls of the cabinet.

11. The cabinet of claim 9, wherein a grating is absent from the lower portion of the cabinet.

12. The cabinet of claim 10, wherein the cabinet includes an exhaust outlet on top of the cabinet.

* * * * *